United States Patent [19]
Strickland

[11] Patent Number: 5,936,467
[45] Date of Patent: *Aug. 10, 1999

[54] DYNAMICALLY INVARIANT AB LINEAR OPERATION AMPLIFIER

[75] Inventor: James C. Strickland, Mesa, Ariz.

[73] Assignee: Rockford Corporation, Tempe, Ariz.

[ * ] Notice: This patent issued on a continued prosecution application filed under 37 CFR 1.53(d), and is subject to the twenty year patent term provisions of 35 U.S.C. 154(a)(2).

[21] Appl. No.: 08/859,327

[22] Filed: May 20, 1997

Related U.S. Application Data

[62] Division of application No. 08/583,443, Jan. 5, 1996, Pat. No. 5,673,000.

[51] Int. Cl.⁶ ........................................... H03F 3/26
[52] U.S. Cl. ................................. 330/255; 330/267
[58] Field of Search ........................ 330/255, 263, 330/267, 268; 381/120

[56] References Cited

U.S. PATENT DOCUMENTS

| | | |
|---|---|---|
| 4,015,212 | 3/1977 | Miyata ............................. 330/255 X |
| 4,274,060 | 6/1981 | Kawanabe ............................. 330/295 |
| 4,286,227 | 8/1981 | Sato ............................. 330/255 |
| 4,334,197 | 6/1982 | Otao ............................. 330/268 |
| 5,523,718 | 6/1996 | Butler ............................. 330/255 |
| 5,673,000 | 9/1997 | Strickland ............................. 330/255 |

*Primary Examiner*—Steven J. Mottola
*Attorney, Agent, or Firm*—Steptoe & Johnson LLP

[57] ABSTRACT

An amplifier providing the linear output of a Class A amplifier and the expanded peak current output and efficiency of a Class AB amplifier. The amplifier includes an input amplifier, a voltage regulator network, a cascode stage, and an output amplifier. The input amplifier amplifies a signal current into two outputs. The cascode stage and the output stage each contain two paths for the amplified outputs. The voltage regulator network interconnects the two paths between the input amplifier and the cascode stage. The voltage regulator network bypasses a high percentage of the quiescent current that is normally contained in the two paths of the cascode stage and the output amplifier stage, thus improving the peak-to-quiescent current output ratio beyond the 2:1 value of traditional Class A amplifiers.

29 Claims, 2 Drawing Sheets

DYNAMICALLY INVARIANT AB LINEAR OPERATION AMPLIFIER

This is a divisional of application Ser. No. 08/583,443, filed Jan. 5, 1996 (now U.S. Pat. No. 5,673,000).

BACKGROUND OF THE INVENTION

The present invention relates to electrical amplifiers, and more particularly to audio power amplifiers.

A Class A audio power amplifier includes a differential amplifier driving a transconductance stage. Class A amplifiers are typically biased, meaning that the transistors conduct (i.e. remain active) during the entire input cycle. To bias the transistors, voltages or currents are applied to the transistors in the amplifier circuit to establish the threshold operating point for each transistor. The current that results in the amplifier circuit from biasing, measured before any signal current is applied, is defined as the quiescent or idling current.

In any amplifier system, three properties determine the purposes for which the amplifier is suited: gain, linearity and efficiency. Gain is the amplification factor of the circuit. The output parameters (voltage or current) are a function of the input parameters multiplied by the gain of the amplifier. Linearity is the extent to which a linear relationship exists between the input and output parameters. The output parameters should exactly correspond to the input parameters multiplied by the gain of the circuit. Any nonlinearities introduced by the circuit will result in a distorted output signal. Finally, the efficiency of the amplifier is the ratio of the output or load power to the input or supply power. Efficiency measures how much of the input power is consumed by the circuit.

To enhance the output, one or more Class B current amplifying buffer stages can be interposed between the transconductance stage of a Class A amplifier and the output devices. A traditional Class B amplifier conducts for half of each cycle which allows for greater efficiency than the Class A amplifier. A typical Class B stage consists of two parallel transistors, one of these transistors is an N-channel type which reproduces the positive half of the cycle, while the other is a P-channel type that reproduces the negative half of the cycle. The two half-cycles are then recombined at the output to produce an amplified version of the original input wave form. However, since Class B amplifiers amplify each half of the input signal by separate transistors, any difference between the transistors result in nonlinearities that contribute to the distortion of the amplified output. Class B amplifiers are also plagued by crossover distortion that occurs as the input signal switches from positive to negative. At crossover, both transistors are off and there is a slight delay until the proper transistor begins to conduct the input signal. Crossover distortion in audio power amplifiers gives rise to unpleasant sounds.

To reduce crossover distortion, the biasing system of a Class B amplifier is adjusted so that the transistors conduct at a point somewhere between the traditional Class A and Class B amplifiers. This hybrid design is known as a Class AB amplifier. In a Class AB amplifier the two parallel transistors of the Class B amplifier are biased with a small, non-zero current. This biasing current eliminates the problem of crossover distortion because both transistors conduct when the input signal switches from positive to negative. Thus, the delay is eliminated as the transistors begin to conduct and crossover distortion is eliminated.

As would be expected, the linearity and efficiency characteristics of Class AB amplifiers fall between those of a true Class A or Class B amplifier. Designers have been reluctant to forego the linearity of Class A amplifiers in favor of the more efficient, but less linear, Class AB systems. Therefore, most audio power amplifiers include the Classic Class A amplifier topology for the driver stage.

Further expanding on the foregoing discussion, FIG. 1 illustrates a specific prior art classic Class A amplifier system. The transconductance stage includes transistors Q1 and Q2 biased by an appropriate biasing system, diodes D1 and D2, and Resistors R1, R2, R3, and R4. The transconductance stage acts as an amplifier in which the output current is a linear function of the input voltage. The complimentary bipolar output transistors Q1 and Q2 are arranged in a push/pull configuration with the output transistors Q1 and Q, biased by an appropriate biasing system. The output devices are connected to the collectors of the output transistors Q1 and Q2 with current provided to the output devices in accordance with the current flowing through the emitter junctions of the output transistors Q1 and Q2 as controlled by the signal from the differential amplifier stage.

The differential amplifier stage consists of transistors Q3 and Q4, resistors R5 and R6, and a current mirror M. The signal to be amplified is received at the base of either Q3 or Q4 which then induces a signal current in the corresponding output path from the differential amplifier to the transconductance stage. The two paths from the differential amplifier to the transconductance devices are developed and processed independently and linearly. This arrangement results in a Class A amplifier with very good linearity, but with low efficiency. Class A amplifiers are typically biased such that the transistors conduct during the entire input cycle which results in the low efficiency because most of the power is consumed by the circuit. Additionally, these Class A audio amplifiers are typically limited to a 2:1 peak-to-quiescent current amplification—that is, the output current is limited to a factor of two times the idling current present in the circuit. This output current is inadequate to drive the desired output devices.

Minimizing the number of stages in the signal path usually results in significant improvements in the stability of the amplifier and the resulting quality of the output. However, as shown in FIG. 2, the Class A audio power amplifier design of FIG. 1 can be modified by the addition of Q5, Q6, and Q7 in a common-base or cascode configuration. Q5 and Q7 are N-channel type bipolar junction transistors where the bases are established at +/−½ of the supply voltage, respectfullyl. Q6 is a P-channel tppe bipolar junction transistor with its base set to +½ of the supply voltage. As is known in the art, the cascode configuration results in greater stability due to the increased frequency response resulting from a reduction of Miller-effect capacitances.

A significant gain in the short-loop design art has been possible due to the use of power metal-oxide semiconductor field effect transistor (MOSFET) output stages. These stages can be driven directly from an appropriate transconductance stage. To date, these bufferless designs have been effected by increasing the power level of the Class A transconductance stage; however, this process quickly becomes unwieldy due to the resulting heat and related effects that occur in the individual components. Even with these difficulties associated with the traditional audio power amplifiers, and as noted above, designers have been reluctant to forego the high quality sound reproduction capability of the highly linear Class A transconductance systems in favor of a more efficient, Class AB system.

SUMMARY OF THE INVENTION

The aforementioned problems are overcome by the present invention which provides a voltage regulator network and a current steering system between the differential amplifier and the transconductance stage to create two signal paths that are recombined at the output. Each signal path between the amplifier and the transconductance stage is interactive and nonlinear. The recombination of the two paths produces the highly linear output signal of traditional Class A amplifiers. Consequently, the invention retains the linearity of a Class A system while providing the power characteristics of a Class AB system.

In sharp contrast to previously known amplifiers which include a cascode stage, the present invention interconnects the two normally independent amplifier paths. The voltage regulator network regulates the voltages and currents propagating from the differential input stage into each path of the basic transconductance stage.

A portion of the input signal is bypassed by the voltage regulator network, resulting in a decreased quiescent current at the cascode stage. Consequently, the peak-to-quiescent current capability of this stage is dramatically increased, resulting in improved amplification and power capabilities.

The two paths are made interactive and nonlinear in a manner which always recombines to the highly linear output characteristics of a Class A system yet has the significantly expanded peak current output and efficiency of a Class AB system. The voltage regulator network current system directs the proper portion of the signal current to each transistor of the cascode stage making them interactive. This results in a continuous and uniformly synchronized output with significantly decreased distortion and reduced high-level harmonic generation.

These and other objects, advantages, and features of the invention will be more readily understood and appreciated by reference to the detailed description of the preferred embodiment and the drawings.

DETAILED DESCRIPTION OF THE PREFERRED EMBODIMENT

Figure 3:
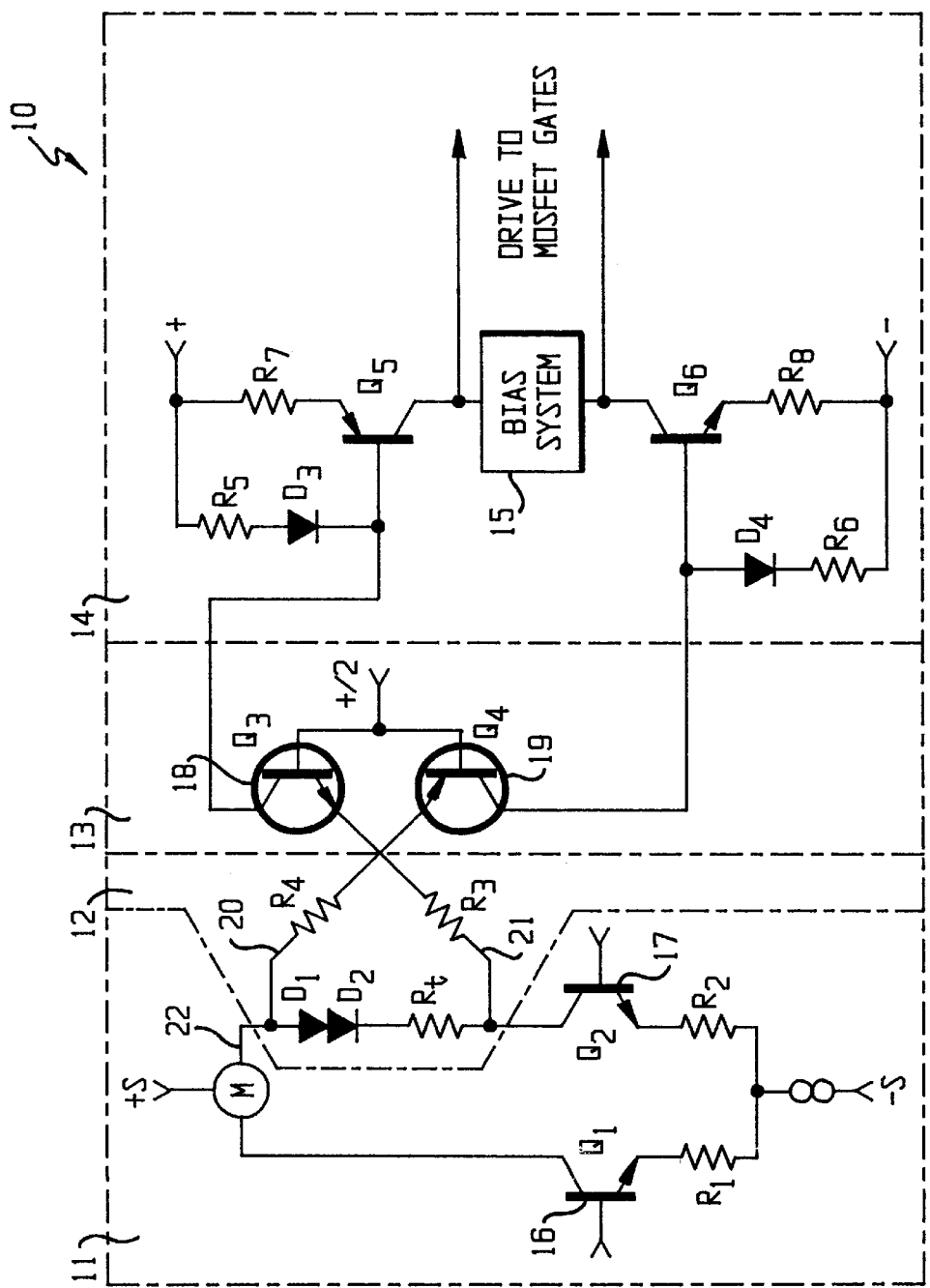
FIG. 3 is a circuit diagram of the present invention.

An amplifier topology in accordance with a preferred embodiment of the present invention is illustrated in FIG. 3 and generally designated 10. As illustrated, the amplifier topology includes a differential input stage 11, a voltage regulator network 12, a cascode stage 13, and a transconductance output stage 14.

The differential amplifier stage 11 includes a conventional current source S, two NPN type bipolar junction transistors Q1 and Q2, emitter resistors R1 and R2, and a current mirror M. The conventional current source provides equivalent quiescent currents at the collectors 16 and 17 of Q1 and Q2. The high impedance outputs of Q2 and the current mirror M cooperate to form a single-ended, push-pull, current-output stage from the differential amplifier stage 11. The current mirror M presents an equivalent output to balance the quiescent current of Q2.

Various types of transistors including metal-oxide semiconductor field effect transistors (MOSFETs) or junction field effect transistors (J-FETs) may be substituted without affecting the performance of the current invention.

The voltage regulator network 12 includes diodes D1 and D2 and trimming resistor Rt is provided to bypass a high percentage of the quiescent current developed at the collector 17 of Q2, and at the output 22 of the current mirror M.

The common base or cascode stage 13 includes transistors Q3 (N-channel type) and Q4 channel type) and resistors R3 and R4. The stage connects the differential amplifier stage 12 with the basic transconductance output system 14. The output current from the current mirror M biases the voltage regulator network and provides quiescent and signal currents to the cascode stage 13.

The trimming resistor Rt of the voltage regulator network 12 permits the emitter resistors R3 and R4 to be raised or lowered to optimize system bias, current headroom, thermal and device-variation stability, as well as normal linear cascode properties.

The transconductance output stage 14 includes complementary bipolar output transistors Q5 (PNP) and Q6 (NPN) in a push/pull configuration with the output transistors Q5 and Q6 biased by an appropriate biasing system 15. Diodes D3 and D4 and resistors R5, R6, R7 and R8 complete the transconductance stage, and the proportional values of these resistors are chosen to establish the gain for this stage.

Operation

In stark contrast to a Class A amplifier, the peak-to-quiescent current-output ratio of the present invention is significantly higher than the 2:1 value of Class A connectivity. The voltage regulator network 12 bypasses a high percentage of the quiescent current developed in Q2 and the current mirror M around Q3 and Q4. This leaves the cascode stage 13 with a greatly reduced quiescent current. Since peak current capability remains unchanged, reducing the quiescent term propagation into Q3 and Q4 greatly improves their peak-to-quiescent current capability. This results in a significant improvement in the overall amplification and power capabilities of the present invention.

The invariant trasconductance properties of the present invention result from the constant sum of the signal current factions contained in the cascode stage 13. The output stage transistors Q5 and Q6 provide full transconductance contribution down to nearly zero current propagation through each branch of the output transconductance system 14. Once zero current propagation is reached in the path containing either Q5 or Q6, the other path must provide all of the transconductance supplied equally by Q5 and Q6 at the quiescent point.

Figure 2:
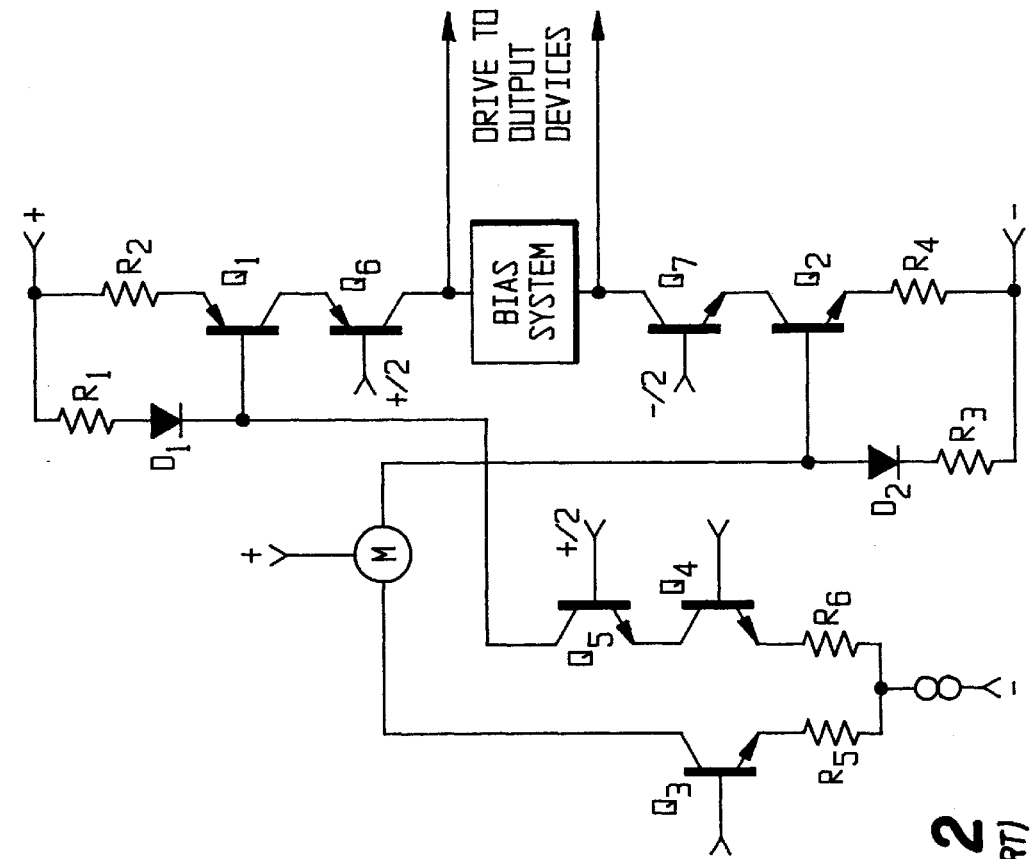
FIG. 2 is circuit diagram of a prior art Class A amplifier topology including a common base or cascode stage.
Figure 1:
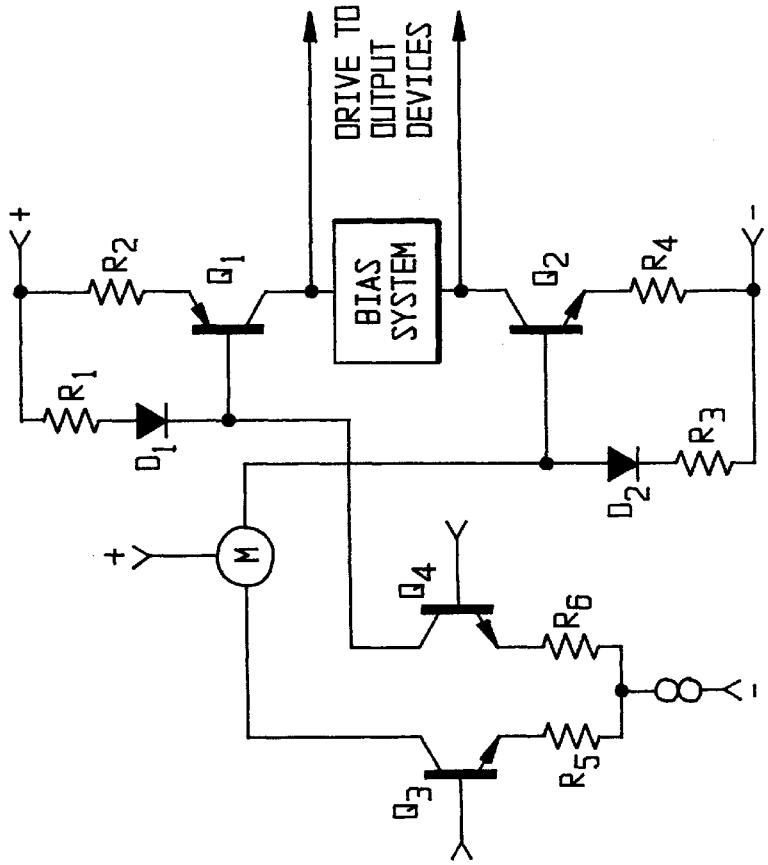
FIG. 1 is a circuit diagram of a prior art Class A amplifier topology.

In the prior art amplifier of FIG. 2, if either of the output transconductance stage transistors Q3 or Q4 were driven linearly to effectively zero current, the output signal would experience significant crossover distortion common in traditional audio amplifiers. This results from the delay associated when either Q3 or Q4 begins to conduct current through its respective path. In order to avoid the resulting distortion that occurs if either Q3 or Q4 were driven linearly to zero current, a relatively smooth and continuous transfer function is required for transferring the transconductance function from one output system path to the other.

In accordance with the present invention, any signal current propagated into the differential amplifier stage 11 is represented as the difference in the current flowing from the output of the current mirror M and the current flowing into the collector 17 of Q2. This signal current is then steered into the cascode stage 13—specifically into the emitters 18 and 19 of Q3 and Q4. The fractional signal current contained in Q3 and Q4 always maintains a constant sum, regardless of the proportion of the signal current carried independently by Q3 or Q4.

The percentage of signal current propagating in each path of the cascade stage 13 and the output transconductance system 14 is determined by the dynamic emitter resistance of the interconnected pair Q3 and Q4. The dynamic emitter resistance of each bipolar transistor Q3 and Q4 varies inversely with the instant total current in each path following the classical exponential transconductance relationship di/dV=ki.

The signal current develops a small AC voltage common to the entire voltage regulator network 12. This small AC voltage causes fractions of the signal current into the cascode stage 13 to be inversely proportional to the sum of the fixed emitter resistors R3 and R4 and the dynamic emitter resistance of the cascode stage transistors Q3 and Q4. Thus, as signal current is generated by the output of the current mirror M and Q2, one emitter path rssace of the cascode stage is decrease and the other increased. As this happens, the signal current is steered progressively into the path of decreasing resistance and away from the path of increasing resistance—the two fractions however always maintaining a constant sum equal to the signal current.

As the proportion of current flowing through one transistor Q4 increases, the left end 20 of its corresponding fixed emitter resistor R4 will increase in potential. As this occurs, the regulator network adjusts the left end 21 of the other fixed emitter resistor by a similar amount. This results in the corresponding emitter 18 of Q3 decreasing in voltage and reducing the current below the quiescent value. By reducing the current flowing through this path, the associated voltage drop across the fixed emitter resistor R3 contained in the path will also be decreased. At this time, the dynamic emitter resistance of either Q3 or Q4 is much greater in one path than the other. This results in one path of the cascode stage 13 containing either Q3 or Q4 to be carrying a greater fraction of the signal current than the other path. As more of the signal current is drawn from the emitter 18 or 19 of the path propagating the increased proportion of the signal current, that path approaches propagation of 100% of the signal current.

Due to the circuit symmetry, identical operation occurs on the opposite phase of the signal current, with the opposite path approaching conducting 100% of the signal current. However, the present invention never operates as a true Class B amplifier because the transistors Q3 and Q4 in the cascode stage 13 and the transistors Q5 and Q6 in the output transconductance stage 14 never reach cutoff. This eliminates the crossover distortion common to Class B amplifiers as one transistor moves from near cutoff to operation. The voltage regulator network 12 provides the excess current needed to drive the transistors Q3 and Q4 of the cascode stage 13 as the percentage of signal current carried by either transistor Q3 or Q4 increases from near zero.

The above description is that of a preferred embodiment of the invention. Various alterations and changes can be made without departing from the spirit and broader aspects of the invention as defined in the appended claims, which are to be interpreted in accordance with the principles of patent law including the doctrine of equivalents.

The embodiments of the invention in which an exclusive property or privilege is claimed are defined as follows:

1. A multistage amplifier comprising:
    a first stage having first and second transistors configured as a differential amplifier having a constant current source connected to emitters of the first and second transistors;
    a second stage having first and second input nodes, wherein the second stage generates an output current in response to a signal at the first input node and receives a sink current in response to a signal at the second input node;
    a current mirror having an input connected to the first transistor and an output connected to the first input node of the second amplifier stage through a first connection path, the second transistor connected to the second input node of the second amplifier stage through a second connection path, the first and second connection paths including a transistor in a cascode configuration; and
    a regulating circuit connected to the current mirror and the second transistor so as to bypass a portion of the current generated by the current mirror away from the first connection path; thereby reducing quiescent current in the second amplifier stage.

2. The amplifier of claim 1 wherein the regulating circuit bypasses quiescent current from the current mirror to the second transistor and develops a voltage potential between a connection to the current source and a connection to the second transistor.

3. The amplifier of claim 1 wherein the first stage generates a preamplified signal as a difference between current flowing out of the current mirror and current flowing into the second transistor.

4. The amplifier of claim 3 wherein the currents in the first and second connection paths maintain a constant sum proportional to the preamplified signal.

5. The amplifier of claim 1 wherein the second amplifier stage is characterized by a ratio of peak current to quiescent current of greater than two (2).

6. The amplifier of claim 1 wherein the resistance of the first connection path varies inversely with the resistance of the second connection path.

7. The amplifier of claim 1 wherein the regulating circuit bypasses a fraction of quiescent current from the current mirror while permitting a fraction of quiescent current to propagate into the first connection path.

8. A method of amplifying a signal to an external load, comprising the steps of:
    generating a signal current in an amplifier stage;
    splitting said signal current into a first propagation signal and a second propagation signal;
    steering each of said first and second propagation signals, respectively, into one of a first and second signal paths, said signal paths each having one of a first and second transistor, said first and second transistors having a common base;
    diverting a portion of a quiescent current away from said first signal path and said second signal path;
    maintaining a sum of said first propagation signal and said second propagation signal as a constant value;
    providing said first propagation signal and said second propagation signal to an output amplifier stage.

9. A method for amplifying an input signal, comprising the steps of:
    preamplifying an input signal to produce a first amplified signal;
    dividing said first amplified signal into intermediate signal portions;
    diverting a portion of a quiescent current away from said intermediate signal portions;
    steering each of said intermediate signal portions into respective transistors, said transistors having a common base, whereby the sum of current signals passing through said respective transistors is a constant equal to said first amplified signal; and amplifying and recombining said intermediate signal portions to produce an output amplified signal.

10. A method as defined in claim 9, wherein said input amplifying step is performed by differentially amplifying said input signal.

11. A method as defined in claim 9, wherein said amplifying and recombining step includes transconductance amplifying.

12. A method as defined in claim 9, wherein said dividing step includes steering said first amplified signal through a voltage regulator network to produce said intermediate signals and to divert said quiescent current.

13. A power amplifier comprising:

an input stage for receiving an input signal and generating a signal current and a quiescent current;

current steering means for directing complementary portions of said signal current through two interactive and nonlinear signal current paths;

voltage regulator means for regulating a voltage between inputs to said signal current paths and diverting at least a portion of said input DC quiescent current away from said current steering means; and an output stage for recombining said complementary portions to form a continuous and uniformly synchronized output signal.

14. The power amplifier of claim 13, wherein said current steering means comprises first and second transistors, said first and second transistors having a common base configuration, and further comprising first and second fixed emitter resistors, wherein said first and second transistors are cascode connected to said input stage through said first and second fixed emitter resistors, respectively.

15. The power amplifier of claim 14, wherein said first and second transistors have interactive gain.

16. The power amplifier of claim 14, wherein said input stage includes third and fourth transistors to which said first and second transistors are cascode connected through said fixed emitter resistors.

17. The power amplifier of claim 14, wherein the first of said two interactive and nonlinear signal current paths comprises said first transistor and said first fixed emitter resistor, and wherein the second of said interactive and nonlinear signal current paths comprises said second transistor and said second fixed emitter resistor, said first and second transistors having first and second dynamic emitter resistances, respectively.

18. The power amplifier of claim 17 wherein said complementary portion of said input signal current directed through said first interactive and nonlinear signal current path is inversely proportional to the sum of the resistance of said first fixed emitter resistor and said first dynamic emitter resistance, and wherein said complementary portion of said input signal current directed through said second interactive and nonlinear signal current path is inversely proportional to the sum of the resistance of said second fixed emitter resistor and said second dynamic emitter resistance.

19. The power amplifier of claim 13, said input stage comprising a differential amplifier stage having a conventional current source, two bipolar junction transistors, emitter resistors and a current mirror.

20. The power amplifier of claim 19, wherein current from said current mirror biases said voltage regulator means and provides quiescent current and signal current to said current steering means.

21. The power amplifier of claim 19, wherein said current mirror provides current output to balance quiescent currents of said two bipolar junction transistors.

22. The power amplifier of claim 19, wherein said conventional current source provides equivalent quiescent currents to said two bipolar junction transistors.

23. The power amplifier of claim 13, wherein said voltage regulator means includes diodes and a trimming resistor for routing a portion of said quiescent current.

24. The power amplifier of claim 13, wherein said voltage regulator means is an adjustable regulated power supply for maintaining a substantially constant voltage.

25. The power amplifier of claim 14, wherein said voltage regulator means has thermal properties matched to said first and second transistors.

26. The power amplifier of claim 13, said output stage comprising a transconductance stage having complementary bipolar transistors in a push/pull configuration.

27. The power amplifier of claim 26, further comprising an output biasing means for biasing said transconductance stage.

28. The power amplifier of claim 13, further comprising an output biasing means for biasing said output stage.

29. A method of amplifying an input signal comprising the steps of:

receiving an input signal;

generating a preamplified signal current and a quiescent current;

directing complementary portions of said preamplified signal current through two interactive and nonlinear signal current paths;

regulating a voltage between inputs to said current paths;

diverting at least a portion of said input DC quiescent current around said two interactive and nonlinear signal current paths; and amplifying said complementary portions to form amplified signals; and combining said amplified signals to form a continuous and uniformly synchronized output signal.

* * * * *